(12) United States Patent
Kato

(10) Patent No.: US 7,949,020 B2
(45) Date of Patent: May 24, 2011

(54) SEMICONDUCTOR LASER AND OPTICAL INTEGRATED SEMICONDUCTOR DEVICE

(75) Inventor: Takashi Kato, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 128 days.

(21) Appl. No.: 12/435,562

(22) Filed: May 5, 2009

(65) Prior Publication Data

US 2009/0296753 A1 Dec. 3, 2009

(30) Foreign Application Priority Data

May 29, 2008 (JP) ................................. 2008-141207

(51) Int. Cl.
*H01S 3/10* (2006.01)

(52) U.S. Cl. .................... 372/20; 372/50.11; 372/50.12; 372/50.121; 372/50.122; 372/96; 372/102

(58) Field of Classification Search .................... 372/20, 372/50.11, 50.12, 50.121, 50.122, 96, 102
See application file for complete search history.

(56) References Cited

U.S. PATENT DOCUMENTS

| 5,347,526 A * | 9/1994 | Suzuki et al. | 372/20 |
| 7,397,833 B2 * | 7/2008 | Takagi | 372/43.01 |
| 2004/0119079 A1 * | 6/2004 | Hayakawa et al. | 257/80 |
| 2007/0104242 A1 * | 5/2007 | Kudo et al. | 372/96 |

OTHER PUBLICATIONS

"Wavelength Tunable DFB LD with High Coupling Coefficient Gratings", written by Nobuhiro Nunoya et al., The collected papers of The Institute of Electronics, Information and Communication Engineers (IEICE) general Conference, C-4-20, p. 282, Mar. 20, 2007 w/English translation.

* cited by examiner

*Primary Examiner* — Minsun Harvey
*Assistant Examiner* — Yuanda Zhang
(74) *Attorney, Agent, or Firm* — Smith, GAmbrell & Russell, LLP

(57) ABSTRACT

A tunable distributed feedback semiconductor laser includes a substrate; an optical waveguide structure disposed on a main surface of the substrate and including an active layer and a diffraction grating, the optical waveguide structure being divided into a first DFB portion, a wavelength-tuning region, and a second DFB portion in that order; a first electrode for injecting carriers into the active layer in the first DFB portion; a second electrode for injecting carriers into the active layer in the second DFB portion; and a third electrode for supplying a wavelength tuning signal to the wavelength-tuning region. The diffraction grating extends over the first DFB portion, the wavelength-tuning region, and the second DFB portion. An optical confinement factor of the wavelength-tuning region is smaller than that of the first and second DFB portions.

14 Claims, 12 Drawing Sheets

PRIOR ART

SEMICONDUCTOR LASER AND OPTICAL INTEGRATED SEMICONDUCTOR DEVICE

BACKGROUND OF THE INVENTION

1. Field of the Invention

The present invention relates to a distributed feedback (DFB) semiconductor laser and an optical integrated semiconductor device.

2. Description of the Related Art

A known semiconductor laser is described in "Wavelength Tunable DFB LD with High Coupling coefficient Gratings" written by Nobuhiro Nunoya et al., The collected papers of The Institute of Electronics, Information and Communication Engineers (IEICE) General Conference, C-4-20, p. 282, 2007. This semiconductor laser includes two distributed feedback (DFB) regions having a grating, and a phase shift region. One of the DFB regions, the phase shift region, and the other DFB region are arranged in that order in the optical axis direction of this semiconductor laser. In this DFB laser structure, the two DFB regions sandwich the phase shift region. These DFB regions and the phase shift region are optically coupled. When a distributed feedback operation is performed in the two DFB regions, the lasing wavelength can be changed within a stopband of the grating formed in the DFB regions by injecting a current into the phase shift region. The principle through which the lasing wavelength is changed will now be described in the following. In the semiconductor laser having the above structure, when a current is injected into the phase shift region through an electrode for wavelength tuning provided in the phase shift region, the refractive index of the phase shift region changes. As a result, the optical length of the phase shift region changes. Accordingly, when the amount of phase shift is adjusted by changing the current injected into the phase shift region, the lasing wavelength changes within the stopband.

SUMMARY OF THE INVENTION

In the grating formed in the above-described DFB regions, the lasing wavelength may discontinuously change (i.e., mode hopping may occur) depending on the initial phase of the grating. The initial phase of the grating is determined by the shape of an end of the grating, the end being adjacent to the phase shift region and the end facet of the DFB laser.

Accordingly, it is an object of the present invention to provide a semiconductor laser and optical integrated semiconductor device in which the lasing wavelength can be continuously changed while suppressing mode hopping more reliably.

According to a semiconductor laser of the present invention, a tunable distributed feedback (DFB) semiconductor laser includes a substrate; an optical waveguide structure disposed on a main surface of the substrate and including an active layer and a diffraction grating that is optically coupled with the active layer, the optical waveguide structure being divided into a first DFB portion, a wavelength-tuning region, and a second DFB portion in that order in an optical axis direction; a first electrode for injecting carriers into the active layer located in the first DFB portion, the first electrode being disposed on the first DFB portion; a second electrode for injecting carriers into the active layer located in the second DFB portion, the second electrode being disposed on the second DFB portion; and a third electrode for supplying a signal for wavelength tuning to the wavelength-tuning region, the third electrode being disposed on the wavelength-tuning region. In the semiconductor laser, the diffraction grating is disposed on the active layer in a direction substantially orthogonal to the main surface, and extends over the first DFB portion, the wavelength-tuning region, and the second DFB portion, and an optical confinement factor of the wavelength-tuning region in the optical waveguide structure is smaller than an optical confinement factor of each of the first DFB portion and the second DFB portion in the optical waveguide structure.

This semiconductor laser includes the diffraction grating that is optically coupled with the active layer in the optical waveguide structure. Accordingly, when the semiconductor laser is driven by injecting carriers into the active layer in the first and second DFB portions through the first and second electrodes, respectively, a distributed feedback operation can be realized. In driving the semiconductor laser in such a manner, when a signal for wavelength tuning is supplied to the wavelength-tuning region through the third electrode, a phase shift of the grating is caused in the wavelength-tuning region disposed between the first DFB portion and the second DFB portion by a change in the refractive index. As a result, a lasing wavelength corresponding to the phase shift can be selected within a reflection wavelength band (stopband) of the grating. The amount of phase shift can be adjusted by the amount of signal supplied to the wavelength-tuning region through the third electrode, and thus the wavelength of a laser light to be emitted can be changed.

In the structure of the above semiconductor laser, the optical confinement factor of the wavelength-tuning region is smaller than the optical confinement factor of each of the first and second DFB portions. Therefore, a boundary current of the active layer in the wavelength-tuning region is larger than a threshold current of the active layer in each of the first and second DFB portions. Herein, the term "boundary current of the active layer in the wavelength-tuning region" refers to a current at which the gain of the active layer in the wavelength-tuning region is equivalent to the waveguide loss. In supplying current more than the boundary current to the wavelength-tuning region, a carrier density in the active layer at the wavelength-tuning region is clamped, and thus a further phase shift may not be caused. However, as described above, since the boundary current of the active layer in the wavelength-tuning region is increased by decreasing the optical confinement factor, a wavelength-tunable range can be widened.

Furthermore, in the above structure, the grating extends in the optical axis direction of the optical waveguide structure and provided over the first DFB portion, the wavelength-tuning region, and the second DFB portion. Therefore, in the inside of the semiconductor laser, an end of the grating is not present at interfaces between the first DFB portion and the wavelength-tuning region and between the second DFB portion and the wavelength-tuning region. Accordingly, mode hopping due to an initial phase of the grating, which is determined by the shape of an end of the grating, does not occur. That is, in the semiconductor laser according to the present invention, the lasing wavelength can be changed while suppressing mode hopping more reliably.

A coupling coefficient of the diffraction grating is preferably 100 cm$^{-1}$ or more. When the coupling coefficient is within this range, the range of the change in the lasing wavelength can be 3 nm or more.

The third electrode is preferably disposed in a central portion of the optical waveguide structure in the optical axis direction. This structure can realize laser oscillation at a lower threshold.

Furthermore, a length of the third electrode in the optical axis direction is preferably 1/10 or less of a length of the optical waveguide structure in the optical axis direction. In this case, a phase-shift effect in the wavelength-tuning region can be more reliably obtained. In addition, by using this structure, a laser beam having a single wavelength can be more reliably generated.

The optical waveguide structure preferably includes an optical confinement layer portion provided adjacent to the active layer in a direction substantially orthogonal to the main surface and having a refractive index lower than the refractive index of the active layer, and the effective refractive index of the wavelength-tuning region in the optical confinement layer portion is lower than the refractive index of each of the first DFB portion and the second DFB portion in the optical confinement layer portion.

Thus, the optical confinement factor of the wavelength-tuning region can be smaller than the optical confinement factor of each of the first DFB portion and the second DFB portion.

According to an embodiment of the present invention, the optical confinement layer portion in each of the first and second DFB portions is preferably composed of a first optical confinement layer, and the optical confinement layer portion in the wavelength-tuning region is preferably composed of the first optical confinement layer and a second optical confinement layer having a refractive index lower than the refractive index of the first optical confinement layer. In this case, preferably, the second optical confinement layer is buried in the first optical confinement layer in the wavelength-tuning region.

The optical waveguide structure may be constituted by stacking a first cladding layer of a first conductivity type, an optical confinement layer portion, an active layer, a third optical confinement layer, a diffraction grating, and a second cladding layer of a second conductivity type on a substrate in that order. The diffraction grating may include a periodic corrugation provided at an interface between the third optical confinement layer and the second cladding layer of the second conductivity type, and the second optical confinement layer in the wavelength-tuning region may be disposed between the first cladding layer of the first conductivity type and the active layer. In this case, the first cladding layer of the first conductivity type and the second optical confinement layer are preferably made of the same semiconductor material. For example, the first optical confinement layer may be made of GaInAsP or AlGaInAs, and each of the first cladding layer of the first conductivity type and the second optical confinement layer may be made of InP.

Alternatively, the optical waveguide structure may be constituted by stacking a first cladding layer of a first conductivity type, a diffraction grating, a fourth optical confinement layer, an active layer, an optical confinement layer portion, and a second cladding layer of a second conductivity type on a substrate in that order. The diffraction grating may include a periodic corrugation provided at an interface between the first cladding layer of the first conductivity type and the fourth optical confinement layer, and the second optical confinement layer in the wavelength-tuning region may be disposed between the active layer and the second cladding layer of the second conductivity type. In this case, the second cladding layer of the second conductivity type and the second optical confinement layer are preferably made of the same semiconductor material. For example, the first optical confinement layer may be made of GaInAsP or AlGaInAs, and each of the second cladding layer of the second conductivity type and the second optical confinement layer may be made of InP.

Alternatively, the optical waveguide structure is preferably a stripe-shaped optical waveguide extending in the optical axis direction, and a width of the wavelength-tuning region in the active layer is smaller than a width of each of the first DFB portion and the second DFB portion in the active layer.

According to this structure, the optical confinement factor of the wavelength-tuning region can be smaller than the optical confinement factor of each of the first DFB portion and the second DFB portion. In this case, the optical confinement layer portion of the optical waveguide structure is preferably composed of a single optical confinement layer extending over the first DFB portion, the wavelength-tuning region, and the second DFB portion.

An optical integrated semiconductor device according to the present invention includes a plurality of tunable distributed feedback semiconductor lasers of the present invention, a semiconductor optical combining portion that is optically coupled with the semiconductor lasers and that combines laser beams emitted from the semiconductor lasers and outputs a combined laser beam, and a semiconductor optical amplifier portion that is optically coupled with the semiconductor optical combining portion and that optically amplifies the combined laser beam output from the semiconductor optical combining portion and outputs an amplified laser beam. In this optical integrated semiconductor device, periods of diffraction gratings in the semiconductor lasers are different from each other, a substrate of each of the semiconductor lasers is a common substrate, and the semiconductor optical combining portion and the semiconductor optical amplifier portion are disposed on the common substrate.

In this optical integrated semiconductor device, laser beams emitted from the semiconductor lasers propagate through the semiconductor optical combining portion, a combined laser beam is then optically amplified in the semiconductor optical amplifier portion, and an amplified laser beam is output to the outside. Each of the semiconductor lasers is the above-described semiconductor laser according to the present invention, and thus the lasing wavelength can be changed within the stopband of the grating without causing mode hopping. Since the periods of the gratings of the semiconductor lasers are different from each other, diffraction wavelengths of the gratings are also different from each other. As a result, the tunable ranges of the lasing wavelength of the semiconductor lasers are different. Accordingly, in the optical integrated semiconductor device, the wavelength of output light can be changed over a wide range compared with the case where a single semiconductor laser is provided. Furthermore, since the semiconductor lasers are provided with a common substrate and the semiconductor optical combining portion and the semiconductor optical amplifier portion are disposed on the common substrate, the size of the optical integrated semiconductor device can be reduced.

The above object, other objects, features, and advantages of the present invention will more easily become apparent from the following detailed description of preferred embodiments of the present invention with reference to the attached drawings.

DESCRIPTION OF THE PREFERRED EMBODIMENTS

Figure 1:
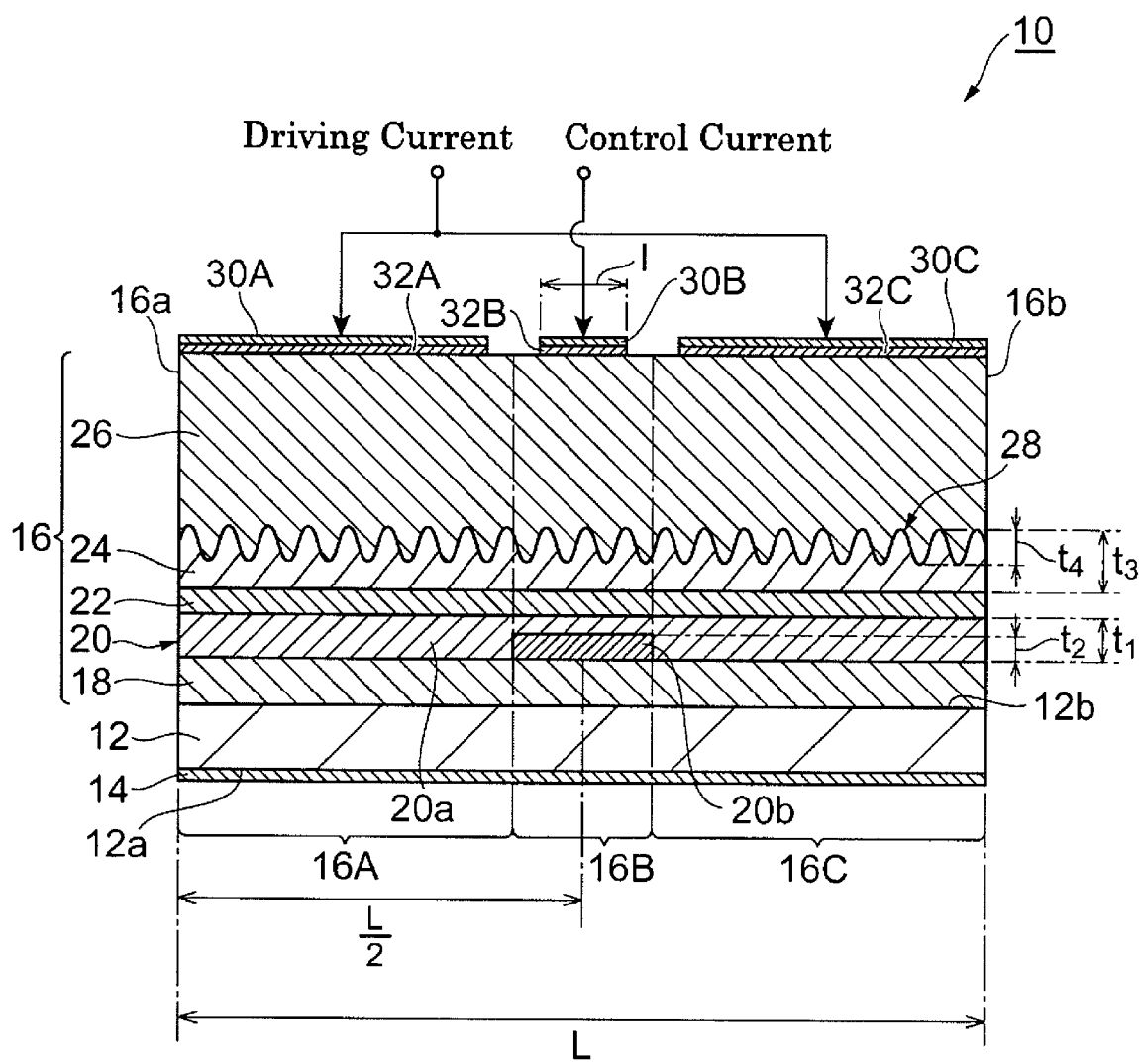
FIG. 1 is a cross-sectional view showing a semiconductor laser according to an embodiment of the present invention.

Semiconductor lasers and an optical integrated semiconductor device according to embodiments of the present invention will now be described with reference to the attached drawings. In the description below, the same components are assigned the same reference numerals, and overlapping description of those components is omitted. The dimensional ratio in the drawings does not necessarily correspond to that in the description.

First Embodiment

FIG. 1 is a cross-sectional view showing a semiconductor laser according to an embodiment of the present invention. FIG. 1 shows a cross-sectional structure in the optical axis direction of the semiconductor laser. A semiconductor laser 10 is a wavelength tunable semiconductor optical device in which the lasing wavelength can be changed, and is suitably used in a wavelength division multiplexing (WDM) transmission system, a spectroscopy system, or the like.

A semiconductor laser 10 includes a semiconductor substrate 12 of a first conductivity type (e.g., n type). A back electrode 14 is provided on a back surface 12*a* of the semiconductor substrate 12. An optical waveguide structure 16 including an active layer 22 is provided on an upper surface (main surface) 12*b* of the semiconductor substrate 12. The optical waveguide structure 16 has a first DFB portion 16A, a wavelength-tuning region 16B, and a second DFB portion 16C which are arranged in the optical axis direction. As shown in FIG. 1, the wavelength-tuning region 16B is disposed between the first DFB portion 16A and the second DFB portion 16C and is optically coupled with the first DFB portion 16A and the second DFB portion 16C. A first electrode 30A and a second electrode 30C for injecting carriers into the active layer 22 are provided on the first DFB portion 16A and the second DFB portion 16C, respectively. A third electrode 30B for supplying a control current (control signal) for wavelength tuning to the wavelength-tuning region 16B is provided on the wavelength-tuning region 16B. The electrodes 30A, 30B, and 30C are disposed on a second cladding layer 26 of a second conductivity type (e.g., p type) with contact layers 32A, 32B, and 32C, respectively, therebetween.

The optical waveguide structure 16 includes a first cladding layer 18 of the first conductivity type, an optical confinement layer portion 20, the active layer 22, a third optical confinement layer 24, and the second cladding layer 26 of the second conductivity type, all of which are stacked on the upper surface 12*b* of the semiconductor substrate 12 in that order. In this structure, the active layer 22 is uniformly provided on the optical confinement layer portion 20, and also functions as a core layer in the optical waveguide structure. In the description below, for the purpose of brief description, a region of the active layer 22 located in the first DFB portion 16A is also referred to as an "active layer 22 in the first DFB portion 16A", a region of the active layer 22 located in the second DFB portion 16C is also referred to as an "active layer 22 in the second DFB portion 16C", and a region of the active layer 22 located in the wavelength-tuning region 16B is also referred to as an "active layer 22 in the wavelength-tuning region 16B". Other components (such as the optical confinement layer portion 20 and the third optical confinement layer 24) constituting the optical waveguide structure 16 may also be expressed in the same manner.

As shown in FIG. 1, the optical confinement layer portion 20, which is adjacent to the active layer 22 in a direction of the normal line of the upper surface 12*b*, includes a first optical confinement layer 20*a* having a refractive index lower than that of the active layer 22, and a second optical confinement layer 20*b* which is a semiconductor layer for wavelength tuning. Furthermore, the sides and the top surface of the second optical confinement layer 20*b* is covered with the first optical confinement layer 20*a* at the wavelength-tuning region 16B in the optical confinement layer portion 20. The refractive index of the second optical confinement layer 20*b* is lower than the refractive index of the first optical confinement layer 20*a* and higher than the refractive index of the first cladding layer 18 of the first conductivity type. As shown in FIG. 1, the optical confinement layer portion 20 in the wavelength-tuning region 16B is composed of the first optical confinement layer 20*a* and the second optical confinement layer 20*b*. In this case, the effective refractive index of the optical confinement layer portion 20 in the wavelength-tuning region 16B is represented by an average refractive index $n_{av}$. Specifically, when the thickness and the refractive index of a semiconductor layer constituting the first optical confinement layer 20*a* are represented by d1 and n1, respectively, and the thickness and the refractive index of the semiconductor layer constituting the second optical confinement layer 20*b* are represented by d2 and n2, respectively, the average refractive index $n_{av}$ is represented by the following formula:

$$n_{av} = \{d1/(d1+d2)\} \times n1 + \{d2/(d1+d2)\} \times n2$$

Accordingly, the average refractive index of the wavelength-tuning region 16B in the optical confinement layer portion 20 is lower than the refractive index of each of the first and second DFB portions 16A and 16C in the optical confinement layer portion 20, and a difference between the average refractive index and the refractive index of the first cladding layer 18 of the first conductivity type is also smaller than a difference between the refractive index of each of the first and second DFB portions 16A and 16C in the optical confinement layer portion 20 and the refractive index of the first cladding layer 18. As a result, the optical confinement factor of the wavelength-tuning region 16B is smaller than the optical confinement factor of each of the first and second DFB portions 16A and 16C.

A periodic corrugation is provided on a surface of the third optical confinement layer 24, the surface disposed opposite the optical confinement layer portion 20 with respect to the active layer 22. In other words, the periodic corrugation is provided at an interface between the third optical confinement layer 24 and the second cladding layer 26 of the second conductivity type. Thereby, the optical waveguide structure 16 has a diffraction grating 28. The grating 28 has a periodic refractive index distribution due to a difference in the refractive index between the third optical confinement layer 24 and the second cladding layer 26 of the second conductivity type. As shown in FIG. 1, the grating 28 is provided so as to extend from an end face 16a to an end face 16b of the optical waveguide structure 16 in the optical axis direction and is optically coupled with the active layer 22. In this case, the end face 16a and end face 16b are end facets of the semiconductor laser 10.

As described above, the optical waveguide structure 16 includes a plurality of semiconductor layers such as the first cladding layer 18 of the first conductivity type, the optical confinement layer portion 20, and the active layer 22. The second optical confinement layer 20b is buried in the first optical confinement layer 20a in the wavelength-tuning region 16B. The wavelength-tuning region 16B is located between the first DFB portion 16A and the second DFB portion 16C.

The structure of the semiconductor laser 10 will now be described in more detail. In this example, the semiconductor substrate 12 is composed of a substrate made of n-type InP.

The first cladding layer 18 provided on the n-type InP substrate is made of n-type InP. The thickness of the first cladding layer 18 is, for example, in the range of 0.2 to 2 µm. The doping concentration of the first cladding layer 18 is, for example, in the range of $1 \times 10^{17}$ to $1 \times 10^{18}$ cm$^{-3}$.

The first optical confinement layer 20a of the optical confinement layer portion 20 is made of, for example, a non-doped group III-V compound semiconductor such as GaInAsP or AlGaInAs. A thickness t1 of the first optical confinement layer 20a (or the optical confinement layer portion 20) is, for example, in the range of 0.02 to 0.5 µm. The second optical confinement layer 20b, which is covered with the first optical confinement layer 20a in the wavelength-tuning region 16B, may be made of the same semiconductor material as the first cladding layer 18 but the conduction type or doping concentration thereof is different each other. For example, the second optical confinement layer 20b is made of non-doped InP. Alternatively, the second optical confinement layer 20b may be made of a non-doped group III-V compound semiconductor, such as GaInAsP or AlGaInAs, having a refractive index lower than that of the first optical confinement layer 20a. A thickness t2 of the second optical confinement layer 20b may be in the range of 0.02 to 0.2 µm. In FIG. 1, the second optical confinement layer 20b is not in contact with the active layer 22. Alternatively, the second optical confinement layer 20b may be in contact with the active layer 22, that is, the thickness t2 of the second optical confinement layer 20b is equal to the thickness t1 of the first optical confinement layer 20a.

The active layer 22 has a multi-quantum well structure including an un-doped GaInAsP as well layers and another un-doped GaInAsP with a composition different from that of the well layers as barrier layers. Alternatively, the active layer 22 may have a multi-quantum well structure composed of AlGaInAs compound semiconductors.

The third optical confinement layer 24 may be made of the same semiconductor material as the first optical confinement layer 20a. A thickness t3 of the third optical confinement layer 24 is, for example, in the range of 0.02 to 0.5 µm. A period Λ of the grating 28 based on the periodic corrugation formed on the surface of the third optical confinement layer 24 is preferably determined so that the emission wavelength of the semiconductor laser 10 is within a band ranging from 1.28 to 1.65 µm. A typical example of the emission wavelength is 1.55 µm, and the period Λ of the grating 28 is 0.241 µm. An example of a coupling coefficient κ of the grating 28 is in the range of 100 to 600 cm$^{-1}$. The coupling coefficient κ can be adjusted by changing a depth t4 of the grating 28. For example, when the coupling coefficient κ is 100 cm$^{-1}$, the depth t4 of the grating 28 is about 100 nm.

The second cladding layer 26 provided on the third optical confinement layer 24 may be made of p-type InP. The doping concentration of the second cladding layer 26 is, for example, in the range of $1 \times 10^{17}$ to $1 \times 10^{18}$ cm$^{-3}$.

The contact layers 32A to 32C provided so as to correspond to the electrodes 30A to 30C, respectively, may be made of p-type GaInAs. The doping concentration of the contact layers 32A to 32C is, for example, in the range of $1 \times 10^{18}$ to $1 \times 10^{20}$ cm$^{-3}$. As shown in FIG. 1, the electrodes 30A to 30C are physically and electrically separated from each other by forming grooves. The grooves are provided between the electrodes. The contact layer 32A, 32B, or 32C is not provided on regions where the electrodes 30A to 30C are separated from each other.

The entire length L of the semiconductor laser 10 shown in FIG. 1 in the optical axis direction is, for example, in the range of 100 to 1,200 µm. As described below, each of the third electrode 30B and the second optical confinement layer 20b is preferably arranged so that the center thereof in the optical axis direction is located in a central portion of the semiconductor laser 10, i.e., at a position L/2 distant from the end face 16a of the optical waveguide structure 16. In addition, the length l of the third electrode 30B in the optical axis direction is preferably about 1/10 of the entire length L of the semiconductor laser 10. For example, when the entire length L of the semiconductor laser 10 is 250 µm, the length l of the third electrode 30B is, for example, 10 µm. The length of the second optical confinement layer 20b in the optical axis direction may be substantially the same as the length l of the third electrode 30B. However, in consideration of spreading of a current that is injected from the third electrode 30B to the p-type second cladding layer 26 through the contact layer 32B, the length of the second optical confinement layer 20b in the optical axis direction may be increased to about double the length of the third electrode 30B.

When the end face 16a of the optical waveguide structure 16 is a light-emitting surface of the semiconductor laser 10, an anti-reflecting coating composed of a dielectric multilayer (not shown) is preferably provided on the end face 16a. Thus, variations in the phase of the grating on the end face 16a can be suppressed because of the less optical feedback at the end face of the grating. As a result, repeatability of the wavelength of a laser beam to be emitted can be improved. The reflectivity of the end face having such a dielectric multilayer for anti-reflecting coating thereon is preferably 0.1% or less. Furthermore, a high-reflecting coating composed of a dielectric film (not shown) may be provided on the end face 16b, which is disposed opposite the end faces 16a functioning as the light-emitting surface. However, in the case where such a high-reflecting coating is provided on the end face 16b, the optical output is affected by variations in the phase of the grating on the end face 16b, though a high optical output can be achieved.

The above-described semiconductor laser 10 can be produced, for example, as follows. First, the n-type first cladding layer 18 is grown on the upper surface 12b of the semiconductor substrate 12. Next, the second optical confinement layer 20b is grown on a predetermined region on the n-type first cladding layer 18, and the first optical confinement layer 20a is then grown on the n-type first cladding layer 18, thus forming the optical confinement layer portion 20. Note that the second optical confinement layer 20b can be formed by selectively growing on the n-type first cladding layer 18 using a dielectric such as $SiO_2$ or SiN as a mask. Alternatively, the second optical confinement layer 20b may be formed by uniformly forming a semiconductor layer constituting the second optical confinement layer 20b on the n-type first cladding layer 18, forming the mask pattern on the semiconductor layer, and then removing unnecessary portions of the semiconductor layer by etching or the like so as to leave a portion of the semiconductor layer located on the predetermined region. Alternatively, in the case where the second optical confinement layer 20b is made of the same material as the n-type first cladding layer 18, a semiconductor layer constituting the n-type first cladding layer 18 may be formed so as to have a thickness larger than that of the n-type first cladding layer 18. The mask pattern for the second optical confinement layer 20b is formed on the semiconductor layer, and unnecessary portions of the semiconductor layer may then be removed by etching or the like so as to leave a portion of the semiconductor layer located on the predetermined region to form the second optical confinement layer 20b.

After the optical confinement layer portion 20 is formed as described above, the active layer 22 and the third optical confinement layer 24 are sequentially grown. Subsequently, the periodic corrugation is formed on the surface of the third optical confinement layer 24 by, for example, a dry etching process. Next, the p-type second cladding layer 26 is grown, and the contact layer 32B and the electrode 30B are then formed on a portion of the p-type second cladding layer 26, the portion being located right above the second optical confinement layer 20b. In addition, the contact layer 32A and the electrode 30A, and the contact layer 32C and the electrode 30C are formed at both sides of the electrode 30B in the optical axis direction. Furthermore, the electrode 14 is formed on the back surface 12a of the semiconductor substrate 12. Thus, the semiconductor laser 10 can be obtained.

The above semiconductor laser 10 includes the grating 28 that is optically coupled with the active layer 22. Accordingly, a distributed feedback operation can be realized by injecting a current into the first DFB portion 16A and the second DFB portion 16C through the electrode 30A and the electrode 30C, respectively, to supply carriers to the active layer 22. In driving the semiconductor laser 10, a control current as a signal for wavelength tuning is supplied from the third electrode 30B to the wavelength-tuning region 16B. Thereby, the refractive index of the wavelength-tuning region 16B, which is disposed between the first DFB portion 16A and the second DFB portion 16C, is changed by injecting the current due to a plasma effect. As a result, a phase-shift effect in the grating can be obtained. More specifically, by controlling the current supplied to the wavelength-tuning region 16B, the lasing wavelength of the semiconductor laser 10 can be adjusted. The lasing wavelength can be adjusted in a wavelength range within a reflection band (stopband) of the grating 28, and the wavelength range is determined by the amount of phase shift in the wavelength-tuning region 16B.

Figure 2:
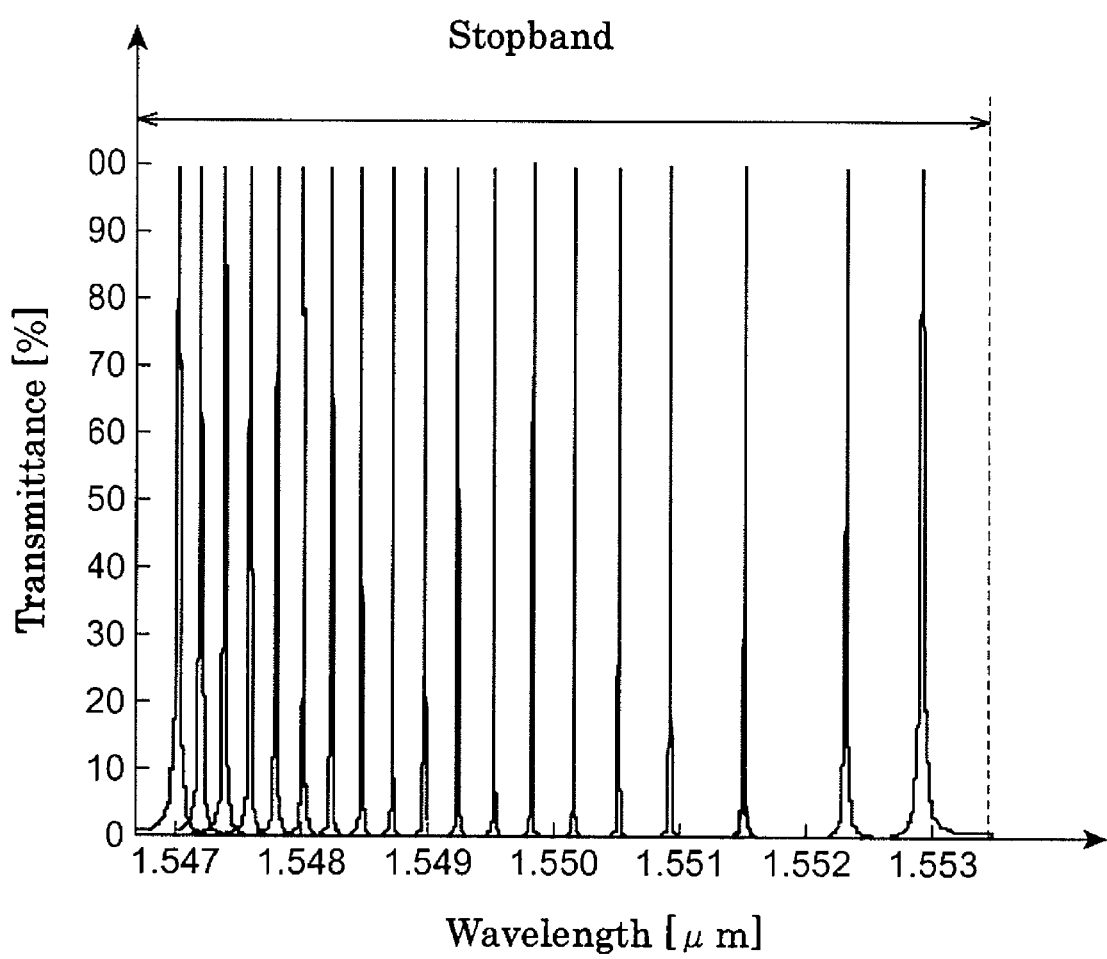
FIG. 2 is a graph showing simulation results of characteristics of a semiconductor laser.

FIG. 2 is a graph showing simulation results of lasing characteristics of a semiconductor laser. The vertical axis represents the transmittance. The term "transmit" means that light generated in the first DFB portion 16A and the second DFB portion 16C can exist with interference caused by the grating 28; that is, the light can be transmitted through the optical waveguide structure 16 in the optical axis direction. Laser oscillation occurs for light having a wavelength with a high transmittance. In FIG. 2, the horizontal axis represents the wavelength.

Simulation conditions are as follows:
(a) First cladding layer 18 of first conductivity type: n-type InP, thickness=2 μm
(b) Second cladding layer 26 of second conductivity type: p-type InP, thickness=2 μm
(c) Active layer 22: non-doped GaInAsP quantum well structure with a band-gap wavelength of 1.55 μm, thickness=100 nm
(d) Optical confinement layer portion 20 (first optical confinement layer 20a and second optical confinement layer 20b):
  (d1) First optical confinement layer 20a: non-doped GaInAsP, thickness t1=100 nm
  (d2) Second optical confinement layer 20b: non-doped InP, thickness t2=50 nm
(e) Third optical confinement layer 24: non-doped GaInAsP, thickness t3=140 nm
(f) Diffraction grating 28: depth t4=80 nm, coupling coefficient $\kappa=320$ cm$^{-1}$
(g) Entire length L of semiconductor laser 10=250 μm
(h) Length l of third electrode 30B=10 μm
The third electrode 30B is arranged at a position L/2 distant from an end face 16a.

Under the above conditions, the center wavelength of a diffraction wavelength of the grating 28 (i.e., the center wavelength of the stopband) is set to be 1.55 μm. Note that the diffraction wavelength of the grating is not the wavelength in the semiconductor optical waveguide structure, and it is converted to the wavelength of light emitted from the semiconductor laser 10 to the space. In this case, the stopband width of the grating 28 is about 7 nm, as shown in FIG. 2. In the simulation, the length of the second optical confinement layer 20b in the optical axis direction is substantially the same as the length l of the third electrode 30B.

In the simulation, the value of the current injected from the third electrode 30B is changed in the range of 0.5 mA, 1 mA, 2 mA, 3 mA, ... 17 mA, and 18 mA. In FIG. 2, the peak wavelengths of the transmittance that sequentially appear from the long-wavelength side correspond to the transmission wavelength (or the lasing wavelength) in the case where the current value is sequentially changed as described above. That is, the transmission wavelength shifts toward the shorter wavelength as the injection current from the third electrode 30B increases. As shown in FIG. 2, the transmission wavelength, i.e., the lasing wavelength is changed within the stopband of the grating 28 by changing the value of the current injected. That is, in the semiconductor laser 10, the lasing wavelength can be changed by changing the amount of current for wavelength tuning supplied to the wavelength-tuning region 16B.

Figure 3:
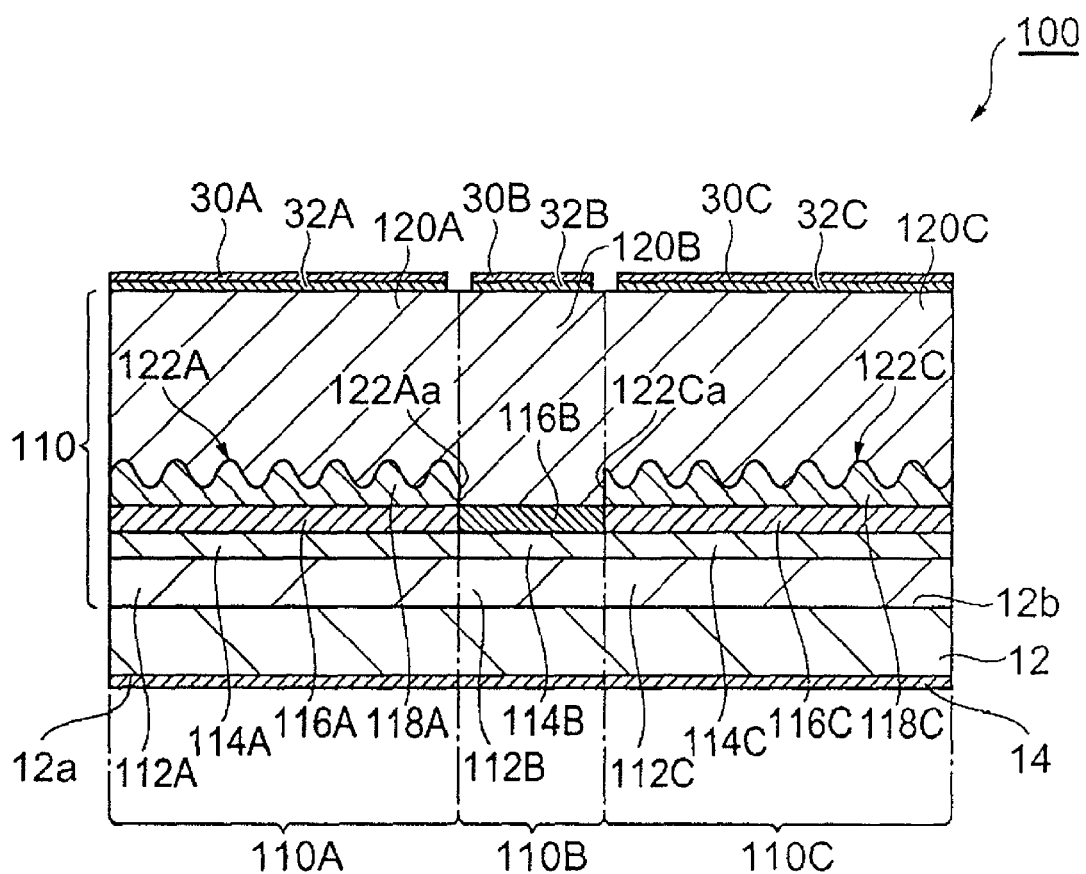
FIG. 3 is a cross-sectional view showing an example of the structure of a known semiconductor laser.

Here, the operation and the advantages of the semiconductor laser 10 will be specifically described by comparing with the conventional structure of a semiconductor laser in the related art shown in FIG. 3.

FIG. 3 shows an example of the structure of a conventional tunable semiconductor laser. A semiconductor laser 100 shown in FIG. 3 includes an n-type semiconductor substrate 12. A back electrode 14 is provided on a back surface 12a of the semiconductor substrate 12. An optical waveguide structure 110 having a first DFB portion 110A, a wavelength-tuning region 110B, and a second DFB portion 110C which are arranged in the optical axis direction is provided on an upper surface 12b of the semiconductor substrate 12.

The first DFB portion 110A is constituted by providing, from the upper surface 12b, an n-type cladding layer 112A, an optical confinement layer 114A, an active layer 116A, an optical confinement layer 118A, a diffraction grating 122A, and a p-type cladding layer 120A in that order. The wavelength-tuning region 110B is constituted by providing, from the upper surface 12b, an n-type cladding layer 112B, an optical confinement layer 114B, an active layer 116B, and a p-type cladding layer 120B in that order. The second DFB portion 110C is constituted by providing, from the upper surface 12b, an n-type cladding layer 112C, an optical confinement layer 114C, an active layer 116C, an optical confinement layer 118C, a diffraction grating 122C, and a p-type cladding layer 120C in that order. Here, for the sake of convenience, a description is made under the assumption that the first DFB portion 110A, the wavelength-tuning region 110B, and the second DFB portion 110C include the n-type cladding layers 112A, 112B, and 112C, the optical confinement layers 114A, 114B, and 114C, and the p-type cladding layers 120A, 120B, and 120C, respectively. However, as shown in FIG. 3, the n-type cladding layers 112A to 112C are composed of a single layer, the optical confinement layers 114A to 114C are composed of a single layer, and the p-type cladding layers 120A to 120C are composed of a single layer.

The active layers 116A and 116C have a GaInAsP quantum well structure with a band-gap wavelength of 1.55 μm. The active layer 116B is made of InGaAsP having a band-gap wavelength of 1.45 μm and has a bulk structure. That is, the active layer 116B is made of only InGaAsP. The gratings 122A and 122C provided so as to correspond to the active layers 116A and 116C, respectively, have the same period and the same coupling coefficient. The gratings 122A and 122C are provided in order to realize a distributed feedback operation. Electrodes 30A, 30B, and 30C are provided on the first DFB portion 110A, the wavelength-tuning region 110B, and the second DFB portion 110C, respectively, with contact layers 32A, 32B, and 32C, respectively, therebetween.

Also in the semiconductor laser 100, the semiconductor laser 100 is driven by injecting current (or carriers) into the active layers 116A and 116C through the electrodes 30A and 30C, respectively, and a current for wavelength tuning is supplied to the wavelength-tuning region 110B through the electrode 30B. When the current for wavelength tuning is supplied to the wavelength-tuning region 110B, the optical length of the active layer 116B is changed by a change in the refractive index, and thus a phase shift of the light reflected from the gratings 122A and 122C occurs. As a result, the lasing wavelength can be changed within the stopband of the gratings 122A and 122C.

In the semiconductor laser 100, the gratings 122A and 122C are provided on the active layers 116A and 116C, respectively, whereas no grating is provided on the active layer 116B. In this case, the lasing wavelength may discontinuously change, that is, mode hopping may occur depending on initial phases of the gratings, which are determined by the shapes of ends 122Aa and 122Ca of the gratings 122A and 122C, respectively. The end 122Aa of the grating 122A is located at the interface between the wavelength-tuning region 110B and the first DFB portion 110A, and the end 122Ca of the grating 122C is located at the interface between the wavelength-tuning region 110B and the second DFB portion 110C. In addition, the period of each of the gratings 122A and 122C is, for example, about 0.2 μm, and thus it is technically difficult to form the shapes of the ends 122Aa and 122Ca in a reproducible manner. As a result, semiconductor laser 100 has a considerable variation in oscillation characteristics, especially lasing wavelength, and has a poor reproducibility in the oscillation characteristics such as lasing wavelength. Furthermore, in the case where the dimension of each of the active layers 116A and 116C in the optical axis direction is longer than the dimension of the active layer 116B in the optical axis direction, it is believed that each of the first DFB portion 110A and the second DFB portion 110C oscillates as an independent DFB laser, and thus it is difficult to obtain a lasing wavelength of a single mode. Furthermore, in the structure shown in FIG. 3, the active layer 116B having a structure different from that of the active layers 116A and 116C is provided between the active layers 116A and 116C. Such a structure is produced by, for example, uniformly forming semiconductor layers to be formed into the active layers 116A and 116C on the optical confinement layers 114A, 114B, and 114C, removing a portion of the semiconductor layers located on the optical confinement layer 114B, and then growing the active layer 116B on the optical confinement layer 114B. In this case, however, crystal defects may be generated at interfaces between the active layer 116B and the active layer 116A, and between the active layer 116B and the active layer 116C, thereby degrading the reliability of laser.

In contrast, in the semiconductor laser 10 shown in FIG. 1, the grating 28 is continuously provided so as to extend from the end face 16a to the end face 16b. In this case, unlike the structure of the semiconductor laser 100 described above, an end of the grating, such as the end 122Aa or 122Ca (refer to FIG. 3), is not present, and thus the above-described mode hopping does not occur. In addition, since the grating 28 is continuously provided so as to extend from the end face 16a to the end face 16b, the above-mentioned production error due to variations in the shapes of the ends also does not occur. As a result, the production yield of the semiconductor laser 10 also increases. Furthermore, in the structure of the semiconductor laser 10, the active layer 22 is uniformly provided on the optical confinement layer portion 20, and thus oscillation of the first DFB portion 16A and the second DFB portion 16C as independent DFB lasers does not occur. Accordingly, a laser beam having a desired single wavelength can be stably output. Furthermore, since the active layer 22 is continuously provided on the optical confinement layer portion 20 as described above, crystal defects described in the above semiconductor laser 100 are not introduced in the active layer. As a result, reliability of the semiconductor laser is also improved, and the semiconductor laser can be produced by a simple process.

In the semiconductor laser 10, unlike the conventional structure shown in FIG. 3, although the active layer 22 is uniformly provided on the optical confinement layer portion 20, a wider wavelength-tunable range within the stopband can be ensured. The reason for this will now be described.

As described above, in the semiconductor laser 10, a change in the lasing wavelength is realized by using a change in the refractive index caused by supplying a current to the wavelength-tuning region 16B. The current supplied to the wavelength-tuning region 16B is smaller than a boundary current of the active layer 22 in the wavelength-tuning region 16B. Herein, the term "boundary current of the active layer 22 in the wavelength-tuning region 16B" refers to a current at which the gain of the active layer 22 in the wavelength-tuning region 16B is equivalent to the waveguide loss. Because the more current than the threshold current is supplied in the first DFB portion 16A and the second DFB portion 16C, the gain of the active layer 22 in the first DFB portion 16A and the second DFB portion 16C is equivalent to the waveguide loss. A carrier density in the active layer 22 in the first DFB portion 16A and the second DFB portion 16C is clamped in supplying the current above the threshold current. However, a carrier density in the active layer 22 in the wavelength-tuning region 16B is not clamped because the smaller current than the boundary current is supplied from the third electrode 30B to the wavelength-tuning region 16B. On the other hand, a carrier density in the active layer 22 in the wavelength-tuning region 16B is clamped in supplying more current than the boundary current, and thus it is difficult to cause a change in the refractive index. Accordingly, the maximum of a control current corresponds to the boundary current of the active layer 22 in the wavelength-tuning region 16B, and the wavelength-tunable range is also determined in accordance with the maximum value.

In the structure of this embodiment, the second optical confinement layer 20b having a refractive index lower than the refractive index of the first optical confinement layer 20a is provided right under the third electrode 30B in the wavelength-tuning region 16B. Accordingly, the optical confinement factor of the wavelength-tuning region 16B is smaller than the optical confinement factor of each of the first DFB portion 16A and the second DFB portion 16C. Therefore, the optical gain in the active layer 22 in the wavelength-tuning region 16B is smaller than the optical gain in the active layer 22 in the first DFB portion 16A and the second DFB portion 16C, and the boundary current of the active layer 22 in the wavelength-tuning region 16B is larger than the threshold current of the active layer 22 in other regions. Clamping of the carrier density in the active layer 22 in the wavelength-tuning region 16B does not occur in supplying smaller current than the boundary current. Accordingly, in the semiconductor laser 10, the wavelength-tunable range can be widened.

Figure 4:
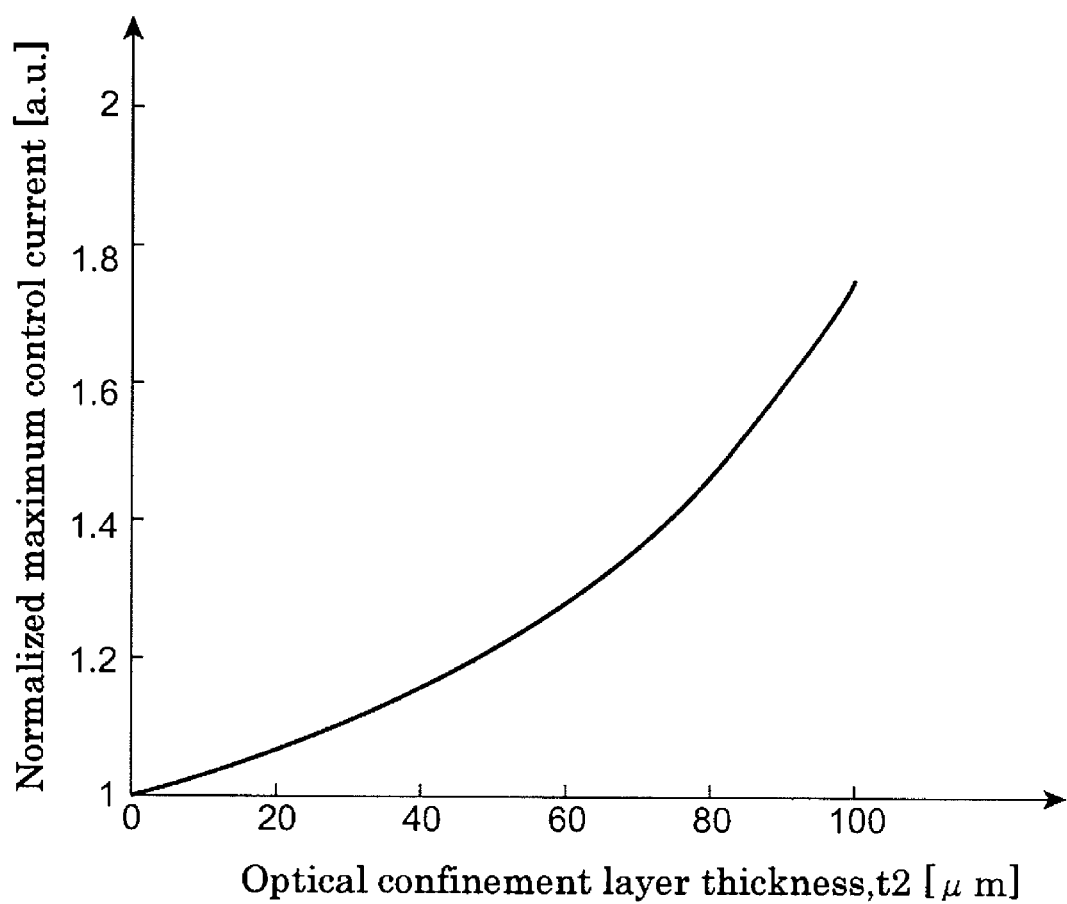
FIG. 4 is a graph showing the relationship between the thickness of an optical confinement layer for tuning and the maximum control current.

In addition, the tunable range of the lasing wavelength can be easily adjusted by, for example, adjusting the thickness t2 of the second optical confinement layer 20b for tuning. This adjustment will be described with reference to FIG. 4. FIG. 4 is a graph showing the relationship between the thickness t2 of the second optical confinement layer 20b and the maximum of a control current supplied from the third electrode 30B. Note that the maximum of the control current corresponds to the boundary current in the wavelength-tuning region 16B. In FIG. 4, the horizontal axis represents the thickness t2 of the second optical confinement layer 20b, and the vertical axis represents the maximum of the control current (maximum control current). The maximum control current shown in the vertical axis is normalized under the assumption that when the thickness t2 is zero (i.e., when the second optical confinement layer 20b is not provided), the maximum control current is 1. Simulation conditions are the same as the conditions of the case shown in FIG. 2 except that the thickness t2 of the second optical confinement layer 20b is changed.

As shown in FIG. 4, as the thickness t2 increases, the maximum control current also increases. This result shows that the wavelength-tunable range is widened as the thickness t2 is increased, because the optical confinement factor of the wavelength-tuning region 16B is decreased. In the example shown in FIG. 4, a normalized maximum control current of about 1.8 can be obtained at the maximum, and thus the wavelength-tunable range can also be widely changed by about 1.8 times compared to the laser structure without the second optical confinement layer 20b. Thus, in the structure of the semiconductor laser 10 shown in FIG. 1, the tunable range of the lasing wavelength can be adjusted by changing the thickness t2.

Furthermore, in the semiconductor laser 10, in the case where a bias current supplied to the first DFB portion 16A and the second DFB portion 16C is a direct current; that is, the bias current is not modulated, the coupling coefficient κ of the grating 28 can be increased because the influence of a wavelength chirp is small even if the coupling coefficient κ of the grating 28 become large. A large coupling coefficient κ widens the stopband, and thus the wavelength-tunable range of the semiconductor laser 10 can be increased. Therefore, the semiconductor laser 10 can be suitably used in a wavelength division multiplexing (WDM) transmission system or the like.

Furthermore, in the semiconductor laser 10, the third electrode 30B is preferably disposed at the center of symmetry of a laser cavity, in other words, at the center of the semiconductor laser 10 in the optical axis direction. For this structure, a laser beam can be efficiently output.

Figure 5:
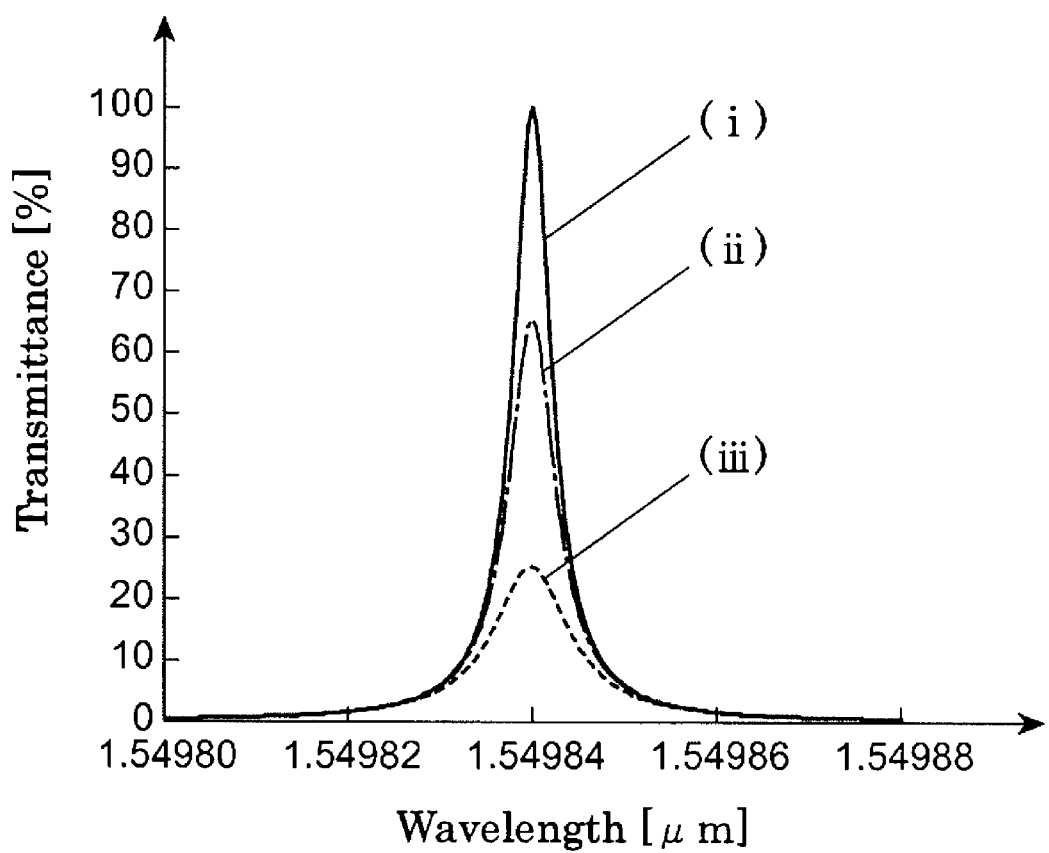
FIG. 5 is a graph showing simulation results in the case where the position of a third electrode is changed.

FIG. 5 is a graph showing simulation results in the case where the position of the third electrode 30B is changed. FIG. 5 shows a change in the transmittance when a center position of the third electrode 30B is changed as follows:

(i) The spectrum shown by the solid line (line (i)) in the figure represents the case where the center position of the third electrode 30B is located in the center of the semiconductor laser 10, i.e., at a position L/2 distant from the end face 10a.
(ii) The spectrum shown by the one-dot chain line (line (ii)) in the figure represents the case where the center position of the third electrode 30B is shifted from the center of the semiconductor laser 10 by 10 μm.
(iii) The spectrum shown by the broken line (line (iii)) in the figure represents the case where the center position of the third electrode 30B is shifted from the center of the semiconductor laser 10 by 20 μm.

In FIG. 5, the current supplied from the third electrode 30B is fixed to 6 mA in the simulation for obtaining the simulation results shown in FIG. 2. Note that, in FIG. 5, the vicinity of a single transmission wavelength is enlarged.

As shown in FIG. 5, as the amount of shift of the third electrode 30B from the center of the semiconductor laser 10 increases, the transmittance tends to decrease. In this case, a threshold current of the semiconductor laser 10 increases, thereby decreasing the quantum efficiency of semiconductor laser. Accordingly, in order to decrease a threshold gain and to obtain a single mode oscillation, it is preferable that the third electrode 30B is arranged such that the center thereof is located in the center of the semiconductor laser 10 in the optical axis direction. By the way, the threshold gain is the gain which is necessary to obtain the laser oscillation at threshold. And a semiconductor laser having smaller threshold gain has a lower threshold current.

In addition, the length l of the third electrode 30B in the optical axis direction is preferably ⅒ or less of the entire length L of the semiconductor laser 10 in the optical axis direction because laser oscillation can be performed more reliably at a single wavelength. A specific description will be made in comparison with an example of a case where the above condition for the length l of the third electrode 30B is not satisfied.

Figure 6:
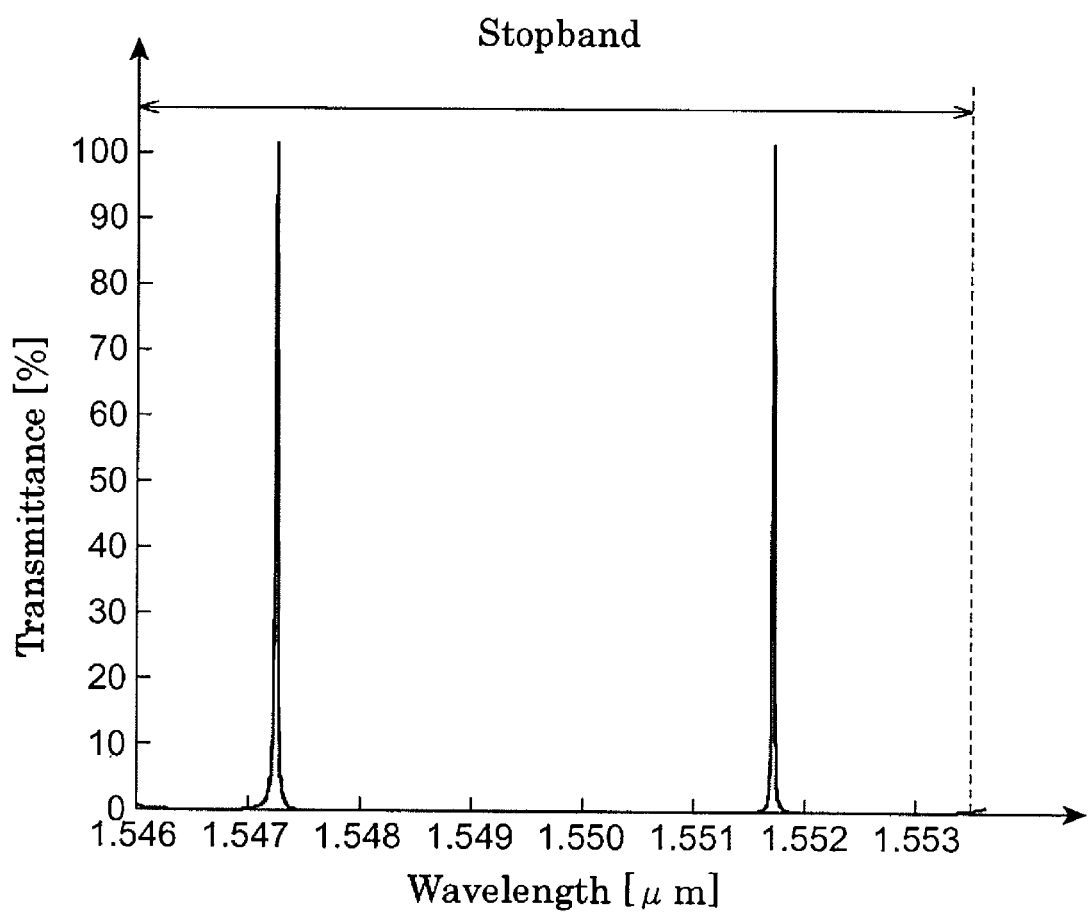
FIG. 6 is a graph showing a simulation result in the case where the length of the third electrode is larger than 1/10 of the length of a semiconductor laser in the optical axis direction.

FIG. 6 shows a simulation result in the case where the length of the third electrode 30B is larger than ⅒ of the length of a semiconductor laser in the optical axis direction. The length l of the third electrode 30B is 30 μm, and the value of current supplied from the third electrode 30B is 15 mA. In this case, as shown in FIG. 6, two peaks of the transmittance are generated within the stopband for a single injection current. Accordingly, the semiconductor laser 10 does not oscillate at a single wavelength.

In contrast, under the condition of the simulation for obtaining the simulation results shown in FIG. 2, the entire length L of the semiconductor laser 10 is 250 μm and the length l of the third electrode 30B is 10 μm, which satisfies the above condition. In this case, as shown in FIG. 2, light having a single wavelength is transmitted even if the injection current supplied from the third electrode 30B changes, and thus laser oscillation can reliably occur at a single wavelength. Accordingly, the length l of the third electrode 30B is preferably 1/10 or less of the entire length L of the semiconductor laser 10. In addition, by satisfying this condition, the peak wavelength within the stopband can be single, and thus laser oscillation can be performed at a single wavelength.

Second Embodiment

Figure 7:
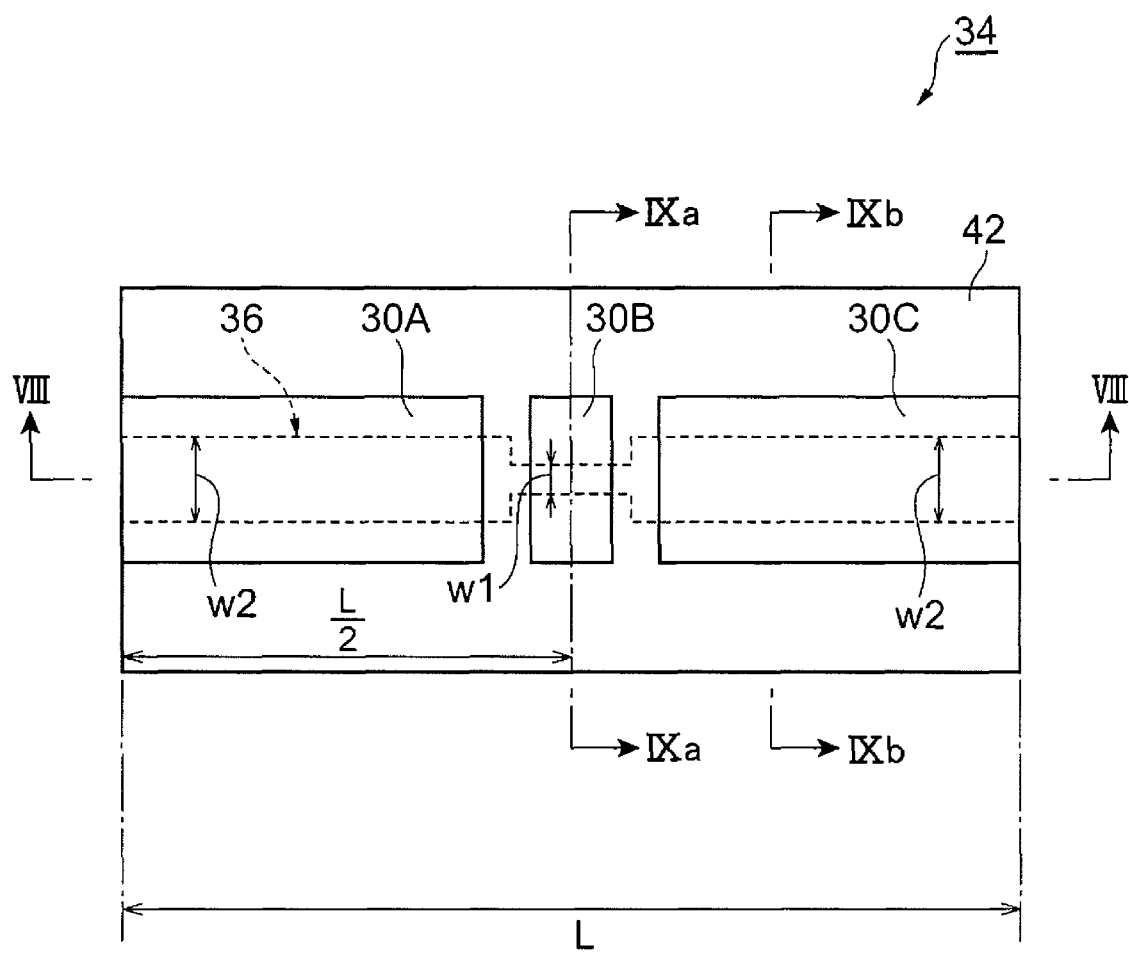
FIG. 7 is a plan view showing a semiconductor laser according to another embodiment of the present invention.
Figure 8:
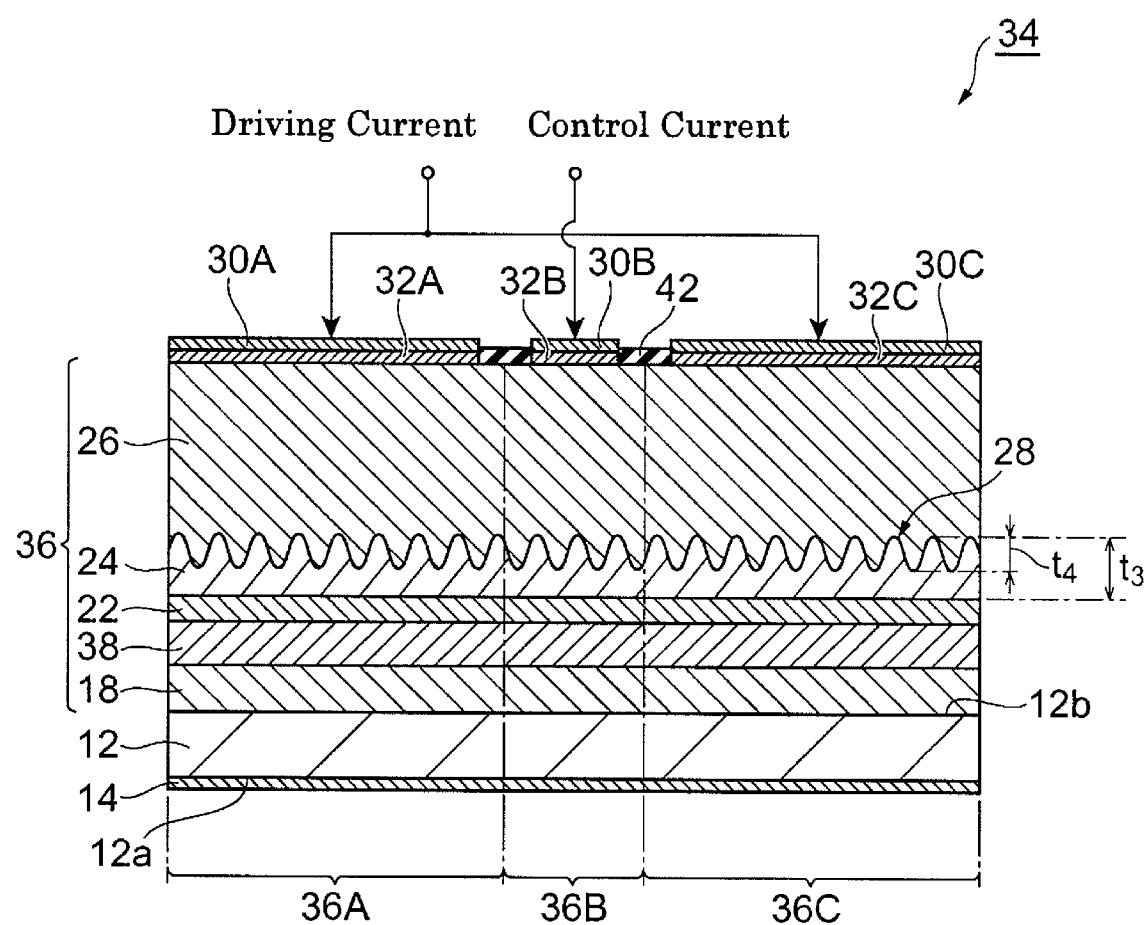
FIG. 8 is a cross-sectional view taken along line VIII-VIII of FIG. 7.
Figure 9A:
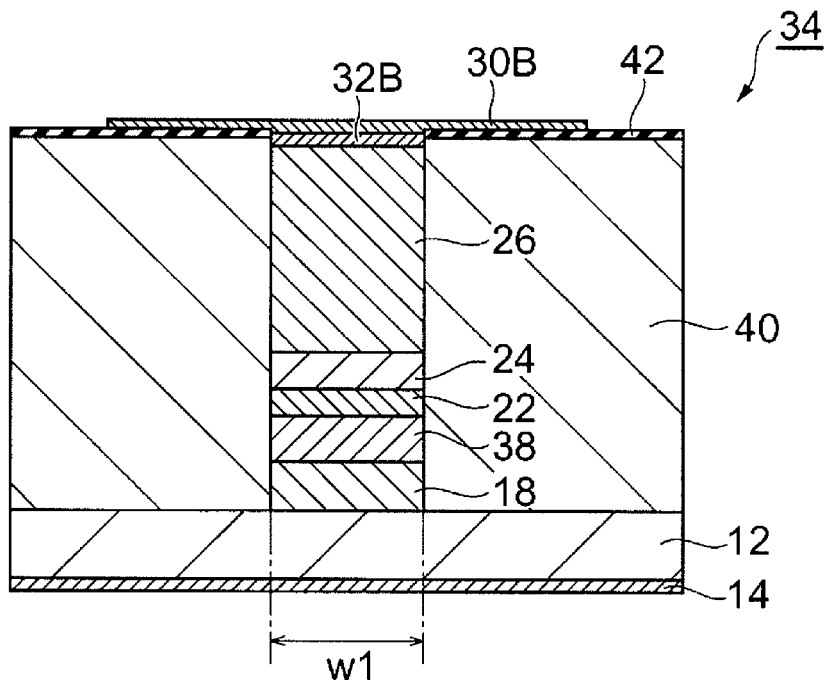
FIG. 9A is a cross-sectional view taken along line IXa-IXa of FIG. 7.
Figure 9B:
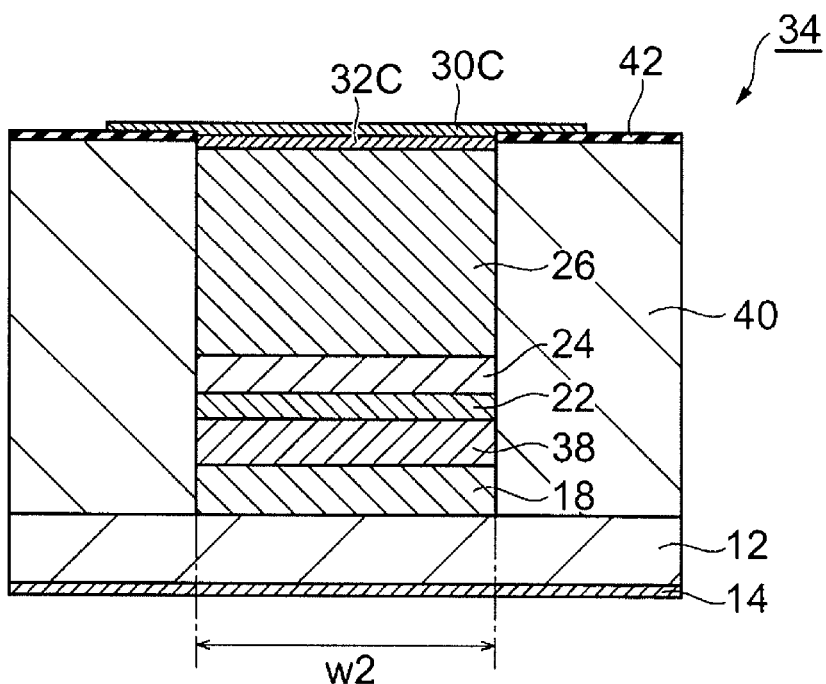
FIG. 9B is a cross-sectional view taken along line IXb-IXb of FIG. 7.

FIG. 7 is a plan view showing a semiconductor laser according to an embodiment of the present invention. FIG. 8 is a cross-sectional view taken along line VIII-VIII of FIG. 7. FIG. 9A is a cross-sectional view taken along line IXa-IXa of FIG. 7, and FIG. 9B is a cross-sectional view taken along line IXb-IXb of FIG. 7.

A semiconductor laser 34 includes a semiconductor substrate 12 of a first conductivity type (e.g., n type). A back electrode 14 is provided on a back surface 12a of the semiconductor substrate 12. A stripe-shaped optical waveguide structure 36 including an active layer 22 is provided on an upper surface (main surface) 12b of the semiconductor substrate 12.

As shown in FIG. 8, the optical waveguide structure 36 has a first DFB portion 36A, a wavelength-tuning region 36B, and a second DFB portion 36C which are arranged in the optical axis direction. The wavelength-tuning region 36B is disposed between the first DFB portion 36A and the second DFB portion 36C and is optically coupled with the first DFB portion 36A and the second DFB portion 36C. An electrode 30A and an electrode 30C are provided on the first DFB portion 36A and the second DFB portion 36C, respectively. An electrode 30B is provided on the wavelength-tuning region 36B.

As shown in FIG. 8, the optical waveguide structure 36 includes a first cladding layer 18 of a first conductivity type (e.g., n type), an optical confinement layer 38, an active layer 22, an optical confinement layer 24, and a second cladding layer 26 of a second conductivity type (e.g., p type), all of which are stacked on the upper surface 12b of the semiconductor substrate 12 in that order. As in the first embodiment, a periodic corrugation is provided on a surface of the optical confinement layer 24, i.e., at an interface between the optical confinement layer 24 and the second cladding layer 26, and the optical waveguide structure 36 has a diffraction grating 28. The grating 28 is continuously provided in the optical axis direction of the optical waveguide structure 36 and is optically coupled with the active layer 22. The optical confinement layer 38 may be made of the same material as the optical confinement layer 24. The thickness of the optical confinement layer 38 is, for example, in the range of 30 to 100 nm.

As shown in FIGS. 9A and 9B, the optical waveguide structure 36 has a stripe-shaped mesa including an active layer 22. The side of mesa structure is covered by a buried layer 40. Thereby, in the semiconductor laser 34, when a direction orthogonal to the normal line direction of the upper surface 12b and the optical axis direction is defined as a width direction (predetermined direction), optical confinement in the width direction can be realized, because the refractive index of the buried layer 40 is smaller than that of the active layer 22. The buried layer 40 may be made of, for example, Fe-doped InP.

The electrodes 30A, 30B, and 30C are provided on regions of the second cladding layer 26 in the first DFB portion 36A, the wavelength-tuning region 36B, and the second DFB portion 36C, with contact layers 32A, 32B, and 32C, respectively, therebetween. An insulating layer 42 made of $SiO_2$ or SiN is preferably provided on the buried layer 40 and regions of the second cladding layer 26 on which the contact layer 32A, 32B, or 32C is not provided.

As in the semiconductor laser 10 of the first embodiment, in the semiconductor laser 34 having the above structure, a phase shift of the grating can be caused by supplying a current to the wavelength-tuning region 36B through the electrode 30B. Accordingly, the lasing wavelength of the semiconductor laser 34 is controlled to be a desired wavelength determined by the amount of phase shift in the wavelength-tuning region 36B. Furthermore, the range of the lasing wavelength of this semiconductor laser 34 is within a wavelength range of a reflection band (stopband) in the first DFB portion 36A and the second DFB portion 36C. That is, the lasing wavelength of the semiconductor laser 34 can be changed within the stopband by changing the amount of phase shift of the grating by adjusting the amount of current injected from the electrode 30B.

In the semiconductor laser 34, as shown in FIGS. 7, 9A, and 9B, the wavelength-tunable range is widened by controlling a width w1 of the wavelength-tuning region 36B to be smaller than a width w2 of each of the first DFB portion 36A and the second DFB portion 36C. This feature will now be described.

Since the width w1 is smaller than the width w2, the width of a region of the active layer 22 located in the wavelength-tuning region 36B is smaller than the width of each of regions of the active layer 22 located in the first DFB portion 36A and the second DFB portion 36C. Accordingly, the optical confinement factor of the wavelength-tuning region 36B is smaller than the optical confinement factor of each of the first DFB portion 36A and the second DFB portion 36C. Therefore, the optical gain in the active layer 22 in the wavelength-tuning region 36B is smaller than the optical gain in the active layer 22 in the first DFB portion 36A and the second DFB portion 36C, and the boundary current of the active layer 22 in the wavelength-tuning region 36B is larger than the threshold current of the active layer 22 in other regions. Clamping of the carrier density in the active layer 22 in the wavelength-tuning region 36B does not occur in supplying smaller current than the boundary current. Thus, as in the case of the first embodiment, the wavelength-tunable range can be widened in the semiconductor laser 34. Accordingly, also in the semiconductor laser 34, the wavelength of a laser light to be emitted can be changed within a wider wavelength-tunable range.

Figure 10:
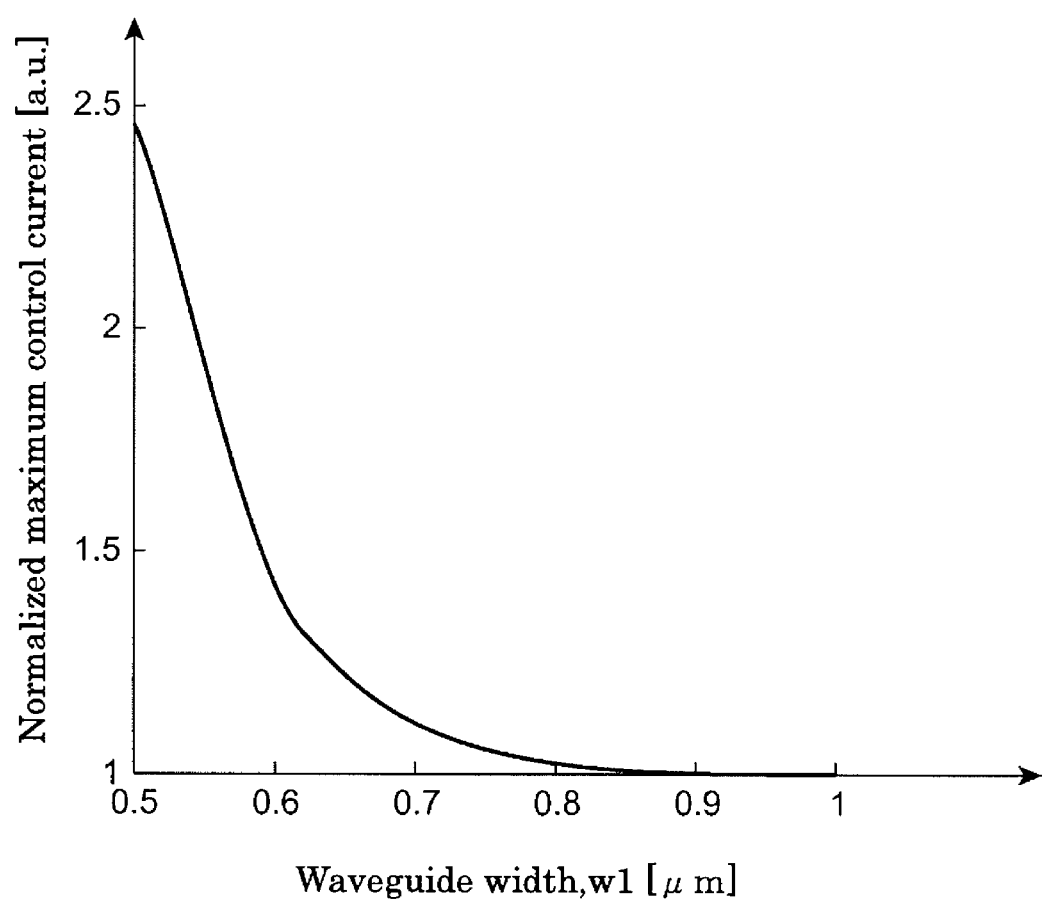
FIG. 10 is a graph showing the relationship between the width of a wavelength-tuning region and the maximum control current.

In this embodiment, the wavelength-tunable range can be adjusted by changing the width w1 of the wavelength-tuning region 36B. The reason for this will be described with reference to FIG. 10. FIG. 10 shows a simulation result in the case where the width of a wavelength-tuning region is changed. In FIG. 10, the horizontal axis represents the width (w1) of the wavelength-tuning region, and the vertical axis represents the value of the maximum control current. The maximum control current corresponds to the boundary current in the wavelength-tuning region 36B. Note that the values of the maximum control current shown in the vertical axis are values normalized under the assumption that when the relationship w1=w2=1 is satisfied, the maximum control current is 1.

Simulation conditions are as follows:
(a) First cladding layer 18 of first conductivity type: n-type InP, thickness=2 μm
(b) Second cladding layer 26 of second conductivity type: p-type InP, thickness=2 μm
(c) Active layer 22: non-doped GaInAsP quantum well structure with a band-gap wavelength of 1.55 μm, thickness=70 nm (d) Optical confinement layer 38: non-doped GaInAsP, thickness=100 nm
(e) Optical confinement layer 24: non-doped GaInAsP, thickness t3=140 nm
(f) Diffraction grating 28: depth t4=80 nm, coupling coefficient κ=320 cm$^{-1}$
(g) Entire length L of semiconductor laser 34=250 μm
(h) Length l of electrode 30B=10 μm The electrode 30B is arranged at a position L/2 distant from an end face 16a.

As shown in FIG. 10, as the width w1 decreases, the maximum control current increases. This result shows that the wavelength-tunable range is widened as the width w1 is decreased. In the example shown in FIG. 10, a normalized maximum control current of about 2.4 can be obtained at the maximum, and thus the wavelength-tunable range can also be widely changed by about 2.4 times at the maximum. Thus, in the semiconductor laser 34, the tunable range of the lasing wavelength can be adjusted by changing the width w1.

In this embodiment, the width w1 of the wavelength-tuning region 36B is decreased. However, it is sufficient that at least the width of the active layer 22 in the wavelength-tuning region 36B is smaller than the width of the active layer 22 in each of the first DFB portion 36A and the second DFB portion 36C.

Third Embodiment

Figure 11:
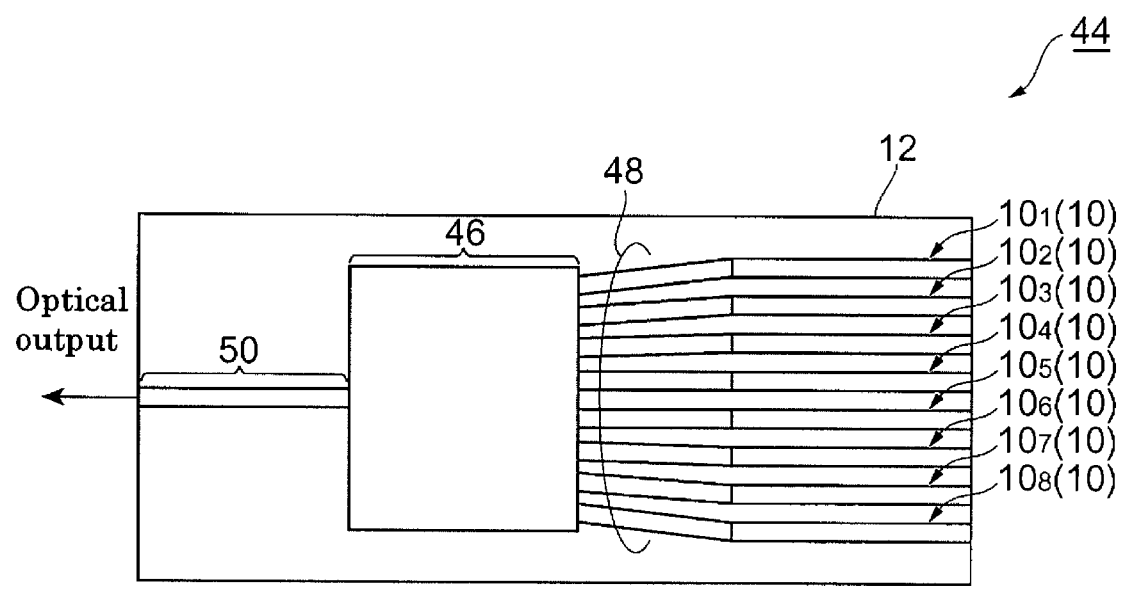
FIG. 11 is a plan view that schematically shows the structure of an optical integrated semiconductor device according to an embodiment of the present invention.

FIG. 11 is a plan view that schematically shows the structure of an embodiment of an optical integrated semiconductor device. FIG. 11 schematically shows components (such as semiconductor lasers 10 and a semiconductor optical combining portion described below) constituting the optical integrated semiconductor device. As shown in FIG. 11, an optical integrated semiconductor device 44 includes arrayed semiconductor lasers 10 each of which is shown in FIG. 1 and can be suitably used as an optical source in a wavelength division multiplexing (WDM) communication system.

The optical integrated semiconductor device 44 includes eight semiconductor lasers 10. Hereinafter, the eight semiconductor lasers 10 are also denoted by semiconductor lasers $10_1$, $10_2$, $10_3$, $10_4$, $10_5$, $10_6$, $10_7$, and $10_8$ for the sake of description. Accordingly, a similar notation may be used for components included in each of the semiconductor lasers $10_1$ to $10_8$.

The semiconductor lasers $10_1$ to $10_8$ are arranged in parallel, and provided with a common semiconductor substrate 12. That is, the optical waveguide structure 16 and the first electrode 30A, the second electrode 30C and the third electrode 30B, all of which are shown in FIG. 1, are provided on eight predetermined regions on the upper surface 12b of the semiconductor substrate 12. Periods $\Lambda_1$ to $\Lambda_8$ of the diffraction gratings $28_1$ to $28_8$ in the semiconductor lasers $10_1$ to $10_8$, respectively, are different. That is, diffraction wavelengths $\lambda_1$ to $\lambda_8$ of the gratings $28_1$ to $28_8$, respectively, are different. Accordingly, a laser beam can be output from each of the semiconductor lasers $10_1$ to $10_8$ by selecting a lasing wavelength from different stopbands.

In order to combine laser beams emitted from the semiconductor lasers $10_1$ to $10_8$, the optical integrated semiconductor device 44 includes a semiconductor optical combining portion 46. An example of the semiconductor optical combining portion 46 is a multi-mode interferometer (MMI). The semiconductor optical combining portion 46 is optically coupled with each of the semiconductor lasers $10_1$ to $10_8$ via a semiconductor optical waveguide 48.

In addition, in order to compensate for an insertion loss by fabricating the semiconductor optical combining portion 46 in the semiconductor optical waveguide 48, the optical integrated semiconductor device 44 further includes a semiconductor optical amplifier portion 50. The semiconductor optical amplifier portion 50 is optically coupled at the downstream of the semiconductor optical combining portion 46.

As shown in FIG. 11, the semiconductor optical combining portion 46, the semiconductor optical waveguides 48, and the semiconductor optical amplifier portion 50 are provided on the semiconductor substrate 12 including the semiconductor lasers $10_1$ to $10_8$. That is, semiconductor stacked structures constituting the semiconductor optical combining portion 46, the semiconductor optical waveguides 48, and the semiconductor optical amplifier portion 50 are provided on the upper surface 12b of the semiconductor substrate 12.

In the above structure, laser beams emitted from the semiconductor lasers $10_1$ to $10_8$ are input to the semiconductor optical combining portion 46 through the semiconductor optical waveguides 48. The input laser beams are combined by the semiconductor optical combining portion 46, and a combined laser beam is then optically amplified in the semiconductor optical amplifier portion 50. And an amplified laser beam is output to the outside.

Each of the semiconductor lasers $10_1$ to $10_8$ has the similar structure as that of the semiconductor laser 10 shown in FIG. 1. Accordingly, the wavelengths of the laser beams emitted from the semiconductor lasers $10_1$ to $10_8$ can be changed within the stopbands of the corresponding gratings $28_1$ to $28_8$. Since the diffraction wavelengths $\lambda_1$ to $\lambda_8$ of the gratings $28_1$ to $28_8$ in the semiconductor lasers $10_1$ to $10_8$, respectively, are different, the stopbands of the gratings $28_1$ to $28_8$ are also different. As a result, the tuning ranges of the lasing wavelengths of the semiconductor lasers $10_1$ to $10_8$ are also different. Accordingly, in the optical integrated semiconductor device 44 in which the semiconductor lasers $10_1$ to $10_8$ are arrayed, the wavelength can be changed over a wider range.

Note that it is preferable that the stopbands of the gratings $28_1$ to $28_8$ in adjacent semiconductor lasers $10_1$ to $10_8$ partly overlap. Accordingly, the wavelength of light output from the optical integrated semiconductor device 44 can be continuously changed.

FIG. 11 shows an example in which the optical integrated semiconductor device 44 includes eight semiconductor lasers 10. However, the number of semiconductor lasers 10 is not particularly limited as long as the optical integrated semiconductor device 44 includes a plurality of semiconductor lasers 10. Furthermore, a semiconductor laser 34 shown in FIG. 7 may be used in place of the semiconductor lasers 10 as semiconductor lasers in the optical integrated semiconductor device 44.

Embodiments of the present invention have been described, but the present invention is not limited to the above embodiments. For example, in the semiconductor laser 10 shown in FIG. 1, the grating 28 is disposed on a side opposite the semiconductor substrate 12 with respect to the active layer 22. Alternatively, the semiconductor laser according to an embodiment of the present invention may have the structure of a semiconductor laser 52 shown in FIG. 12.

Figure 12:
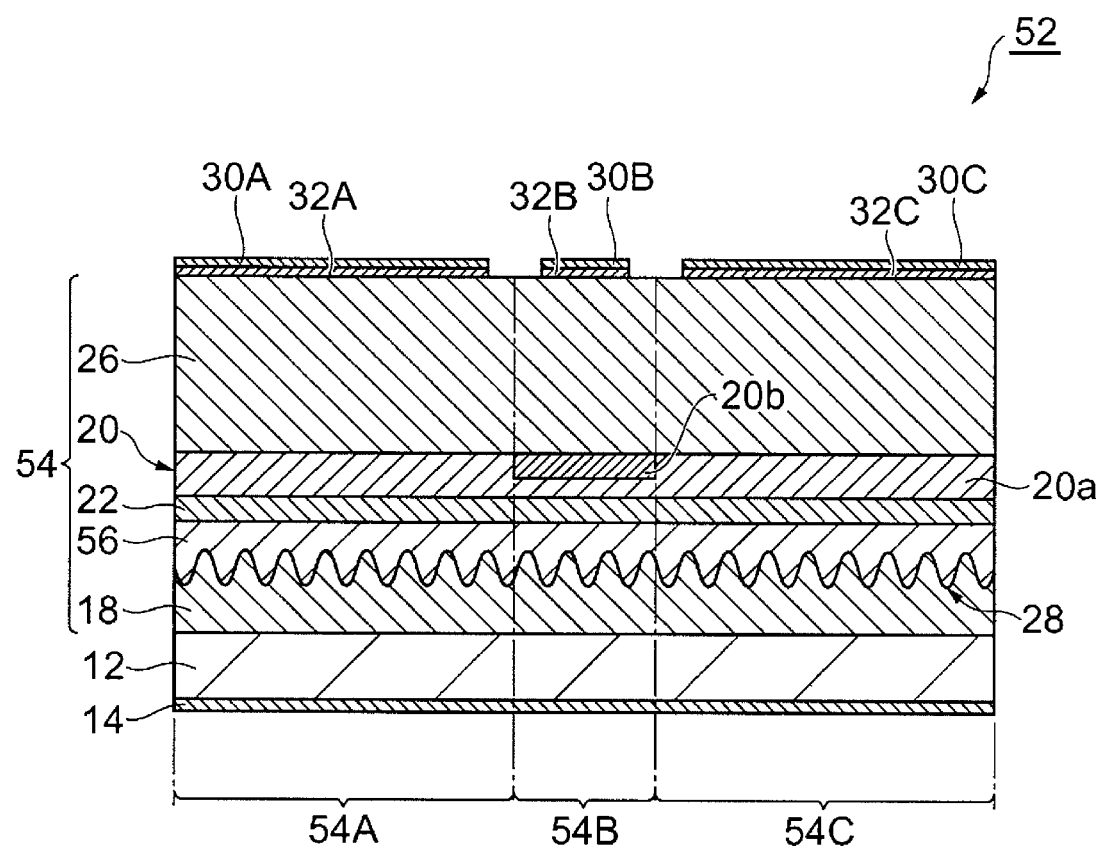
FIG. 12 is a cross-sectional view showing a semiconductor laser according to another embodiment of the present invention.

The semiconductor laser 52 includes an optical waveguide structure 54 instead of the optical waveguide structure 16 shown in FIG. 1. The optical waveguide structure 54 differs from the optical waveguide structure 16 mainly in that a diffraction grating 28 is disposed on the semiconductor substrate 12 side with respect to an active layer 22. In this case, as shown in FIG. 12, an optical confinement layer portion 20 is provided on the second cladding layer 26 side with respect to the active layer 22. Also in this optical waveguide structure 54, a region where an optical confinement layer 20b is provided in the optical axis direction constitutes a wavelength-tuning region 54B, and regions disposed at both sides of the wavelength-tuning region 54B constitute a first DFB portion 54A and a second DFB portion 54C. In producing the semiconductor laser 52, after a periodic corrugation is formed on the surface of a first cladding layer 18 of a first conductivity type, a fourth optical confinement layer 56 is grown.

A structure in which the grating 28 is provided on the semiconductor substrate 12 side with respect to the active layer 22 has been described as a modification of the semiconductor laser 10 shown in FIG. 1. Similarly, also in the case of the semiconductor laser 34 shown in FIG. 7, the grating 28 may be provided on the semiconductor substrate 12 side with respect to the active layer 22.

In the description of the structure of the semiconductor laser 10, 34 and 52, the case where an InP substrate is used as the semiconductor substrate 12 has been described. Alternatively, a substrate made of, for example, GaAs may be used. In such a case, the materials of other layers are appropriately selected in accordance with the material of the semiconductor substrate 12. For example, when the semiconductor substrate 12 is made of GaAs, an optical waveguide structure 16, 36 and 54 may be made of GaAs or AlGaAs The principle of the present invention has been described in the preferred embodiments with reference to the drawings. It is to be understood by those skilled in the art that the present invention can be changed in the arrangement and in the details without departing from the principle. The present invention is not limited to the specific structures disclosed in the embodiments. Accordingly, all modifications and changes derived from the scope of Claims and the spirit thereof are claimed.

What is claimed is:

1. A tunable distributed feedback (DFB) semiconductor laser comprising:
    a substrate;
    an optical waveguide structure disposed on a main surface of the substrate and including an active layer and a diffraction grating that is optically coupled with the active layer, the optical waveguide structure being divided into a first DFB portion, a wavelength-tuning region, and a second DFB portion in that order in an optical axis direction;
    a first electrode for injecting carriers into the active layer located in the first DFB portion, the first electrode being disposed on the first DFB portion;
    a second electrode for injecting carriers into the active layer located in the second DFB portion, the second electrode being disposed on the second DFB portion; and
    a third electrode for supplying a signal for wavelength tuning to the wavelength-tuning region, the third electrode being disposed on the wavelength-tuning region, wherein
    the diffraction grating is disposed on the active layer in a direction substantially orthogonal to the main surface, and extends over the first DFB portion, the wavelength-tuning region, and the second DFB portion,
    an optical confinement factor of the wavelength-tuning region in the optical waveguide structure is smaller than an optical confinement factor of each of the first DFB portion and the second DFB portion in the optical waveguide structure,
    the optical waveguide structure includes an optical confinement layer portion disposed adjacent to the active layer in a direction substantially orthogonal to the main surface and having a refractive index lower than the refractive index of the active layer,
    the effective refractive index of the wavelength-tuning region in the optical confinement layer portion is lower than the refractive index of each of the first DFB portion and the second DFB portion in the optical confinement layer portion,
    the optical confinement layer portion in each of the first DFB portion and the second DFB portion is composed of a first optical confinement layer, and
    the optical confinement layer portion in the wavelength-tuning region is composed of the first optical confinement layer and a second optical confinement laying having a refractive index lower than the refractive index of the first optical confinement layer.

2. The semiconductor laser according to claim 1, wherein a coupling coefficient of the diffraction grating is 100 cm$^{-1}$ or more.

3. The semiconductor laser according to claim 1, wherein the third electrode is disposed in a central portion of the optical waveguide structure in the optical axis direction.

4. The semiconductor laser according to claim 1,
    wherein the second optical confinement layer is buried in the first optical confinement layer in the wavelength-tuning region.

5. The semiconductor laser according to claim 1,
    wherein the optical waveguide structure is constituted by stacking a first cladding layer of a first conductivity type, the optical confinement layer portion, the active layer, a third optical confinement layer, the diffraction grating, and a second cladding layer of a second conductivity type on the substrate in that order,
    the diffraction grating includes a periodic corrugation disposed at an interface between the third optical confinement layer and the second cladding layer of the second conductivity type, and
    the second optical confinement layer in the wavelength-tuning region is disposed between the first cladding layer of the first conductivity type and the active layer.

6. The semiconductor laser according to claim 5, wherein the first cladding layer of the first conductivity type and the second optical confinement layer are made of the same semiconductor material.

7. The semiconductor laser according to claim 5, wherein the first optical confinement layer is made of GaInAsP or AlGaInAs, and
    each of the first cladding layer of the first conductivity type and the second optical confinement layer is made of InP.

8. The semiconductor laser according to claim 1, wherein the optical waveguide structure is constituted by stacking a first cladding layer of a first conductivity type, the diffraction grating, a fourth optical confinement layer, the active layer, the optical confinement layer portion, and a second cladding layer of a second conductivity type on the substrate in that order,
    the diffraction grating includes a periodic corrugation disposed at an interface between the first cladding layer of the first conductivity type and the fourth optical confinement layer, and
    the second optical confinement layer in the wavelength-tuning region is disposed between the active layer and the second cladding layer of the second conductivity type.

9. The semiconductor laser according to claim 8, wherein the second cladding layer of the second conductivity type and the second optical confinement layer are made of the same semiconductor material.

10. The semiconductor laser according to claim 8, wherein the first optical confinement layer is made of GaInAsP or AlGaInAs, and
each of the second cladding layer of the second conductivity type and the second optical confinement layer is made of InP.

11. The semiconductor laser according to claim 1, wherein the optical waveguide structure is a stripe-shaped optical waveguide extending in the optical axis direction, and
a width of the wavelength-tuning region in the active layer is smaller than a width of each of the first DFB portion and the second DFB portion in the active layer.

12. An optical integrated semiconductor device comprising:
a plurality of tunable distributed feedback semiconductor lasers;
a semiconductor optical combining portion that is optically coupled with the semiconductor lasers and that combines laser beams emitted from the semiconductor lasers and outputs a combined laser beam; and
a semiconductor optical amplifier portion that is optically coupled with the semiconductor optical combining portion and that optically amplifies the combined laser beam output from the semiconductor optical combining portion and outputs an amplified laser beam,
wherein each of the tunable distributed feedback semiconductor lasers includes an optical waveguide structure disposed on a main surface of a substrate and including an active layer and a diffraction grating that is optically coupled with the active layer, the optical waveguide structure being divided into a first DFB portion, a wavelength-tuning region, and a second DFB portion in that order in an optical axis direction; a first electrode for injecting carriers into the active layer located in the first DFB portion, the first electrode being disposed on the first DFB portion; a second electrode for injecting carriers into the active layer located in the second DFB portion, the second electrode being disposed on the second DFB portion; and a third electrode for supplying a signal for wavelength tuning to the wavelength-tuning region, the third electrode being disposed on the wavelength-tuning region, wherein the diffraction grating is disposed on the active layer in a direction substantially orthogonal to the main surface, and extends over the first DFB portion, the wavelength-tuning region, and the second DFB portion, an optical confinement factor of the wavelength-tuning region in the optical waveguide structure is smaller than an optical confinement factor of each of the first DFB portion and the second DFB portion in the optical waveguide structure, the optical waveguide structure includes an optical confinement layer portion disposed adjacent to the active layer in a direction substantially orthogonal to the main surface and having a refractive index lower than the refractive index of the active layer, the effective refractive index of the wavelength-tuning region in the optical confinement layer portion is lower than the refractive index of each of the first DFB portion and the second DFB portion in the optical confinement layer portion, the optical confinement layer portion in each of the first DFB portion and the second DFB portion is composed of a first optical confinement layer, and the optical confinement layer portion in the wavelength-tuning region is composed of the first optical confinement layer and a second optical confinement layer having a refractive index lower than the refractive index of the first optical confinement layer,
periods of the diffraction gratings in the plurality of semiconductor lasers are different from each other,
the substrate of each of the semiconductor lasers is a common substrate, and
the semiconductor optical combining portion and the semiconductor optical amplifier portion are disposed on the common substrate.

13. A tunable distributed feedback (DFB) semiconductor laser comprising:
a substrate;
an optical waveguide structure disposed on a main surface of the substrate and including an active layer and a diffraction grating that is optically coupled with the active layer, the optical waveguide structure being divided into a first DFB portion, a wavelength-tuning region, and a second DFB portion in that order in an optical axis direction;
a first electrode for injecting carriers into the active layer located in the first DFB portion, the first electrode being disposed on the first DFB portion;
a second electrode for injecting carriers into the active layer located in the second DFB portion, the second electrode being disposed on the second DFB potion; and
a third electrode for supplying a signal for wavelength tuning to the wavelength-tuning region, the third electrode being disposed on the wavelength-tuning region, wherein
the diffraction grating is disposed on the active layer in a direction substantially orthogonal to the main surface, and extends over the first DFB portion, the wavelength-tuning region, and the second DFB portion,
an optical confinement factor of the wavelength-tuning region in the optical waveguide structure is smaller than an optical confinement factor of each of the first DFB portion and the second DFB portion in the optical waveguide structure, and
a length of the third electrode in the optical axis direction is $1/10$ or less of a length of the optical waveguide structure in the optical axis direction.

14. The semiconductor laser according to claim 13, wherein the optical waveguide structure is a stripe-shaped optical waveguide extending in the optical axis direction,
a width of the wavelength-tuning region in the active layer is smaller than a width of each of the first DFB portion and the second DFB portion in the active layer, and
an optical confinement layer portion of the optical waveguide structure is composed of a single optical confinement layer extending over the first DFB portion, the wavelength-tuning region, and the second DFB portion.

* * * * *